United States Patent [19]
Chiesa et al.

[11] Patent Number: 5,524,286
[45] Date of Patent: Jun. 4, 1996

[54] BASEBAND PREDISTORTION SYSTEM FOR THE ADAPTIVE LINEARIZATION OF POWER AMPLIFIERS

[75] Inventors: Roberto D. Chiesa, Milan; Alessandro Guido, Monza; Marco Stanzani, Brugherio, all of Italy

[73] Assignee: Alcatel Italia S.p.A., Milan, Italy

[21] Appl. No.: 355,629

[22] Filed: Dec. 14, 1994

[30] Foreign Application Priority Data

Dec. 14, 1993 [IT] Italy ................... MI93A2609

[51] Int. Cl.$^6$ ................ H04B 1/04; H04L 25/49
[52] U.S. Cl. ............ 455/126; 375/297; 330/149
[58] Field of Search ................ 455/126, 127, 455/63; 330/149; 332/123, 103, 159; 375/297, 308

[56] References Cited

U.S. PATENT DOCUMENTS 5,123,031  6/1992  Kuisma ................... 330/149 X
5,266,906  11/1993  Inahashi ................... 330/149

FOREIGN PATENT DOCUMENTS 2239770  7/1991  United Kingdom.

OTHER PUBLICATIONS

Transactions of the Institute of Electronics and Communication Engineers of Japan, Section E., vol. E74, No. 6 Jun. 1991, Tokyo, Japan, pp. 1503–1511, Y. Akaiwa, "Digital Modulation/Demodulation Techniques for Mobile Radio Communic. in Japan".

"Adaptive Linerisation Using Pre-Distortion" by Michael Faulkner et al, IEEE CH 2846-4/90 pp. 35–40.

Nagata, Yoshinori, "Liner Amplification Technique for Digital Mobile Communications", IEEE CH2379-1/89, pp. 159–164.

Primary Examiner—Chi H. Pham
Attorney, Agent, or Firm—Ware, Fressola, Van Der Sluys & Adolphson

[57] ABSTRACT

The invention relates to a baseband predistortion system for the adaptive linearization of power amplifiers and to a radiotransmitter using the predistortion system. It is based upon the updating of two error tables, one for the amplitude and one for the phase, whose content is used for correcting the baseband samples. The content of the tables is obtained by accumulating the difference, suitably weighed, between the sampling entering the predistortion device and the demodulated feedback value.

11 Claims, 3 Drawing Sheets

BASEBAND PREDISTORTION SYSTEM FOR THE ADAPTIVE LINEARIZATION OF POWER AMPLIFIERS

TECHNICAL FIELD

The present invention relates to a baseband predistortion system for the adaptive linearization of power amplifiers and to a radio transmitter making use of the predistortion system.

BACKGROUND OF THE INVENTION

In the past, mobile communication theory and practice have emphasized constant-envelope modulation schemes such as FM or CPM (Continuous Phase Modulation) in order to allow power amplifiers to work in the nonlinear operating zone near saturation. This permits the efficiency to be increased and do not generate intermodulation products in the adjacent channels.

At present, the main problem is due to limited portion available spectrum and therefore other types of modulation, spectrally more effective, have been taken into account, e.g. n-QPSK and, more in general, n-QAM with baseband filtering. Unfortunately these methods do not feature a constant envelope and the operating point of the RF power amplifier must be chosen with care to avoid disturbances on the spectrum due to intermodulation products. On the other hand, making an amplifier to work in the linear zone (class A) leads to a significant decrease in the efficiency and therefore suitable linearization techniques are to be adopted.

The idea of solving the distortion problem, caused by power amplifiers, through adaptive baseband-operated linearizing devices is not new.

In particular, the article "Adaptive Linearization using Predistortion" by M. Faulkner, T. Mattson and W. Yates IEEE CH 2846-4/90 pages 35 to 40, describes a predistortion device based upon the updating of error tables, whose content is used for correcting the baseband samples. In this case, an access mode to such tables is used which is directly proportional, in a uniform manner, to the amplitude of the input signal and to the distorted signal of the amplifier.

The main drawbacks encountered with this type of predistortion device, and also with others already known, are caused by slow convergence, inaccurate calculations, long processing times and loop instability phenomena.

SUMMARY OF THE INVENTION

A first object of the present invention is to provide a predistortion system which is free from the drawbacks of the above-mentioned systems.

Another object of the invention is to provide a predistortion system having a structure that is simple, easy to realize and inexpensive.

These and other objects are achieved through a baseband predistortion system of an input signal for the adaptive linearization of a power amplifier including at least one updatable error table, means for generating the addresses of said table and predistortion device, in which the elements contained in said table are used for predistorting said input signal, characterized in that said address generator generates the addresses as a function of the value of the amplitutde of the input signal. It is also achieved by a radio transmitter incorporating such a predistortion system.

By generating the addresses in relation to the distribution of the input signal amplitude value, it is possible to obtain a remarkable increase in the convergence rate.

By suitably weighing the calculated elements of the error table, the inaccuracy in error calculation is reduced and a slight increase in the convergence rate is also obtained.

Another interesting feature of this predistortion device is that it is an open-loop system which is based upon the concurrent access to the same tables from the predistortion process and from the error calculation-updating process. The loop is open in the sense that the updating of the tables may be not carried out in real time, i.e. the distorted samples from the power amplifier are simply necessary for updating the error tables. This fact avoids the arising of intrinsic instabilities of closed-loop systems.

BRIEF DESCRIPTION OF THE DRAWINGS

The characteristics and advantages of the invention will result better from the following description taken in conjunction with the attached drawings wherein.

BEST MODE FOR CARRYING OUT THE INVENTION

Figure 1:
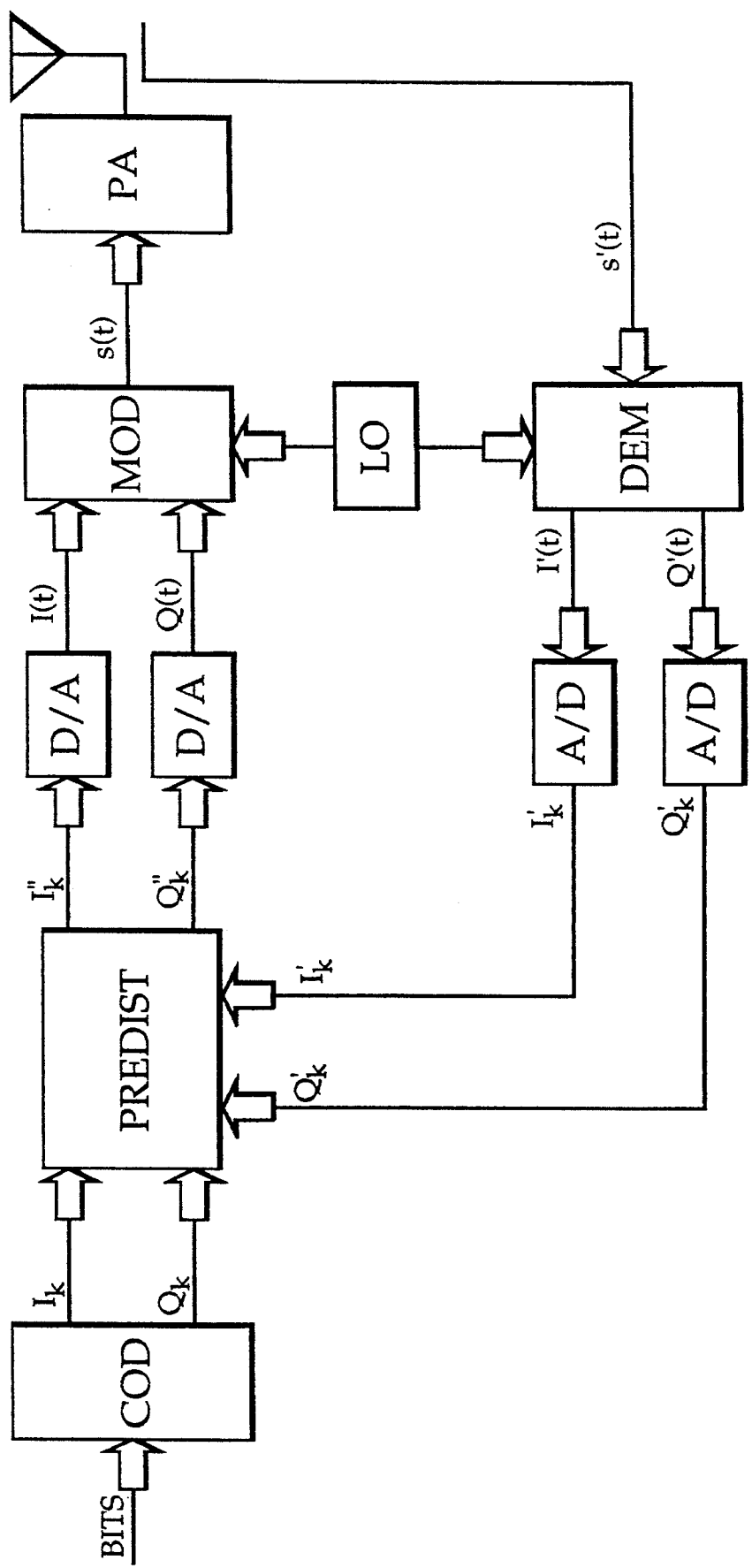
FIG. 1 is a block diagram of a radio transmitter with the predistortion system.

In FIG. 1 there is represented the environment in which the invention is placed.

The input signal having passed through an encoder COD reaches an adaptive predistortion device PREDIST. The predistortion device is also reached by a return signal from the antenna, demodulated by block IEM and converted by converters A/I). The outgoing signal from the distortion device is converted by converters D/A, modulated by block MOD, amplified by power amplifier PA and then fed to the antennna. A local oscillator LO is used for generating the oscillations necessary for modulator MOD and demodulator DEM. Through the use of converters A/D and D/A it is noted that the signal is composed of an imaginary part Q and a real part I. The discrete time input signal $$(1) Sk = Ik + jQk = \rho k \exp jOk$$

is obtained by sampling at instants $Tk = kT$ the baseband complex signal $$(2)\ S(t) = I(t) + jQ(t) = \rho(t) e^{jo(t)}$$

where k is an integer, T is the sampling instant. In a practical implementation, the samples Sk of mg. (1) can be generated directly by the encoder.

The coordinate conversion equations are:

$$(3) I(t) = \rho(t) \cos O(t)\ Q(t) = \rho(t) \sin O(t)$$

$$\rho(t) = [I^2(t) + Q^2(t)]^{1/2}\ O(t) = \tan^{-1}[Q(t)/I(t)]$$

The predistorted output S"k (in rectangular coordinates) is then converted to analog form through a D/A converter and sent to the mixer and to the power amplifier (the frequency conversion is indicated by a sole passage for simplicity), whose output is partially fed back to a down converter (the local oscillator must be the same for both conversions). The distorted input S'k is the result of the A/D conversion of the amplifier demodulated output. The sole assumption made on the system is that distortion introduced by the radio parts of the transmitter is representable by two functions AM-AM and AM-PM: this means that the linearizing device acts as a phase-amplitude modulator superimposed on the baseband signal $$\rho out = g(\rho in) \text{ amplitute modulation}$$

$$\theta\ out = f(\rho in)$$

The form of f(.) and g(.) qualifies the non-linearity. Equations (4) further imply that distortion and error functions on amplitude and phase $\epsilon\rho$ and $\epsilon\theta$ depend only upon the amplitude of the input signal, i.e.:

$$\epsilon\rho = \epsilon\rho(\rho,\theta) = \epsilon\rho(\rho)$$

$$\epsilon\theta = \epsilon\theta(\rho,\theta) = \epsilon\theta(\rho)$$

This hypothesis works things in such a way that the errors are a function of a sole variable and simplifies to a large extent the implementation both from the viewpoints of memory occupation (it requires tables of reduced size) and of speed (the number of cells to be visited is smaller), The form of functions (5) can be seen as a "signature" of system because it depends on the transfer function of the entire amplifying chain.

It is conceivable to process the error by using the in-phase $\epsilon_I$ and quadrature $\epsilon_Q$ components $$\epsilon_I = \epsilon_I(I,Q)$$

$$\epsilon_Q = \epsilon_Q(I,Q)$$

in order to avoid the coordinate conversions however it can be shown that these functions cannot be represented as dependent on a sole variable and, therefore, it is not possible to reduce the amount of memory utilized.

The algorithm converges when after a certain time S'k approaches Sk so that the error approaches 0, in which case the values written of the table do not change any more unless the type of distortion is modified. Representation (6) is suitable for high symbol rates (in the order of the Mbit/s), because it does not waste time for coordinate conversion, and when the required convergence rate is low (the term required for visiting all the elements of the table formed by many pairs I-Q, is clearly longer than in case (4), such time is proportional to the number of the table elements).

From now on, representation (5) will be followed, being more suitable for low symbol rates (of the order of tens of Kbit/s) typical of the mobile systems.

The system updates a pair of error tables (one for the amplitude and the other for the phase) which will be read out by the predistortion device for the correction of the baseband samples such tables are set to zero at the start.

Figure 2:
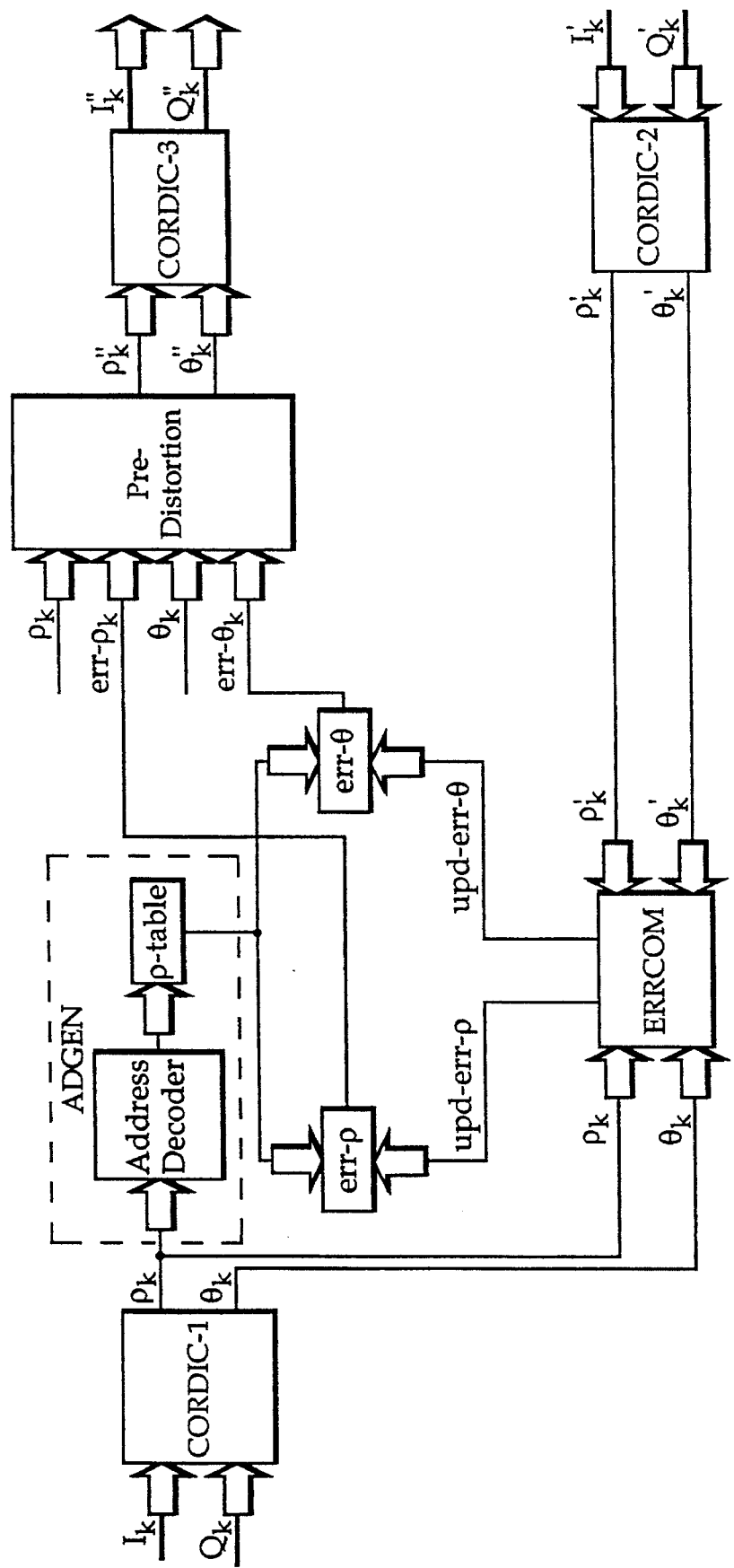
FIG. 2 is a block diagram of the predistortion system.

FIG. 2 shows a block diagram of the system that can be seen as composed by three parallel working processes.

The signal coming from encoder COD of FIG. 1 is converted both in amplitude $\rho$ and in phase e by the coordinate converter CORDIC 1. The amplitude $\rho$ is applied at the it, put of the address generator ADGEN. The amplitude $\rho$ and the phase $\theta$ are also applied at the input of block ERRCOM; applied to it are also amplitude $\rho$ and phase $\theta'$ coming from coordinate converter CORDIC 2 which receives the signal from converters A/D of FIG. 1. The output of block ERRCOM is applied to tables err-$\rho$ and err-$\theta$ for their updating. The address of these tables also with amplitude $\rho$ and phase $\theta$ are applied to block PREDIST whose output is applied to coordinate converter CORDIC 3. The output of CORDIC 3 is applied to converters D/A of FIG. 1. In a practical embodiment, the error function described by equation (5) will be represented by discrete tables and with a finite precision:

$$\epsilon_\rho(k) = \epsilon_\rho(\rho_k)$$

$$\rho_k = KI_k, k=0 \ldots \text{TABLE\_SIZE-1}$$

$$\epsilon_\theta(k) = \epsilon_\theta(\theta_k)$$

where TABLE-SIZE is the number of the elements in the table (for reasons of simplicity and implementation it is the same for both tables and it is a power of 2) while Ik is the quantization pitch which will depend on k should a non uniform quantization be used. In any case the dynamics of the input Imax must be:

$$(8) I_{max} = \Sigma_{i=0 \ldots \text{TABLE\_SIZE-1}} I_i$$

The performances of the system depend on TABLE-SIZE and on the precision chosen for the representation of the samples.

In general, the larger the TABLE-SIZE, the less the quantization error made in calculating the table address will be: however this requires a lower rate of convergence since more time is necessary for visiting all of the table.

Another important parameter of the system, when the adopted phase-amplitude modulation is linear, is the oversampling factor OVS (i.e. the number of samples produced by the modulator for each symbol). Assuming that the device used is fast enough to be able to process all the samples, the greater the OVS, the shorter the time required for the algorithm convergence.

For the address generation, the address of the element of the error tables described by equations (5), that have to be updated starting from the amplitude of the input signal, is evaluated: the entire set of the possible amplitudes is mapped into the set of possible addresses, so that the whole acts as a decoding. The manner in which the input amplitudes are mapped into the set of addresses is nonlinear and causes a non uniform quantization. Obviously this procedure is possible only when the distribution of the input amplitudes is known: it makes the algorithm more rigid because it makes the loading of a new amplitudes-addresses mapping necessary if the modulation parameters are changed.

The quantization intervals each have an amplitude which is inversely proportional to the probability that the amplitude of the input sample will fall in said interval; in this manner the probability that the amplitude of the input sample falls within a predetermined interval is on average the same for all intervals. This technique considerably increases the rate of convergence of the algorithm without affecting the other performance; in particular, the spectral purity degree reached is about the same as in the case of uniform quantization. In this case the address is no longer given by $$(9)\ An = \rho in / Ik$$

where $$(10) Ik = Imax / \text{TABLE\_SIZE},$$

but it is necessary to compare the input amplitude $\rho$ with the values Ik (thresholds) arranged in increasing order in a table. The values Ik are fixed and are computed only once by studying the statistics of the input amplitudes. For simplicity of computation, this new table is of the same dimensions as the error table and with a number of elements which is a power of 2 in such a way as to be able to apply the binary research algorithm.

For the error calculation, the following procedure is used;

Let $Sk = \rho k \exp j\theta k$ be the baseband input signal and $S'k = \rho'k \exp j\theta'k$ be the feedback distorted output of the amplifier, the calculated error is simply:

$$\epsilon_\rho(k)=S(\rho k - \rho'k)$$

(11) with $S \leq S_{max} = 2/G_{max}$ $$\epsilon_\theta(k)=S(\theta k - \theta'k)$$

where S is a velocity factor and Gmax is the maximum differential gain of the amplifier chain:

$$G_{max} = \max_\rho \left[ \frac{d}{d\rho} g(\rho) \right] \quad (12)$$

where $g(\rho)$ is the amplitude transfer characteristic (AM-AM) of the nonlinearity, Clearly the error evaluation both for phase and amplitude is affected by an imprecision $\zeta$ in the interval

(13) $0 \leq \zeta \leq 0.5 Ik$ where I is the quantization pitch.

The imprecision is $\zeta = 0$ (100% accuracy) when the input amplitude $\rho$ coincides with $\Sigma_{i=0...k-1} I_i$ exactly, while it will be $\theta = 0.5$ Ik (minimum accuracy) if $\rho = \Sigma_{i=0...k} I_i$.

It should be noted that I= Ik because these results are valid both for non-uniform and uniform quantizations. In the latter case $\theta_{max} = 0.5$ I and it must be $\rho = kI$ for the maximum accuracy and $\rho = (K+1)I$ for the minimum accuracy.

Figure 3:
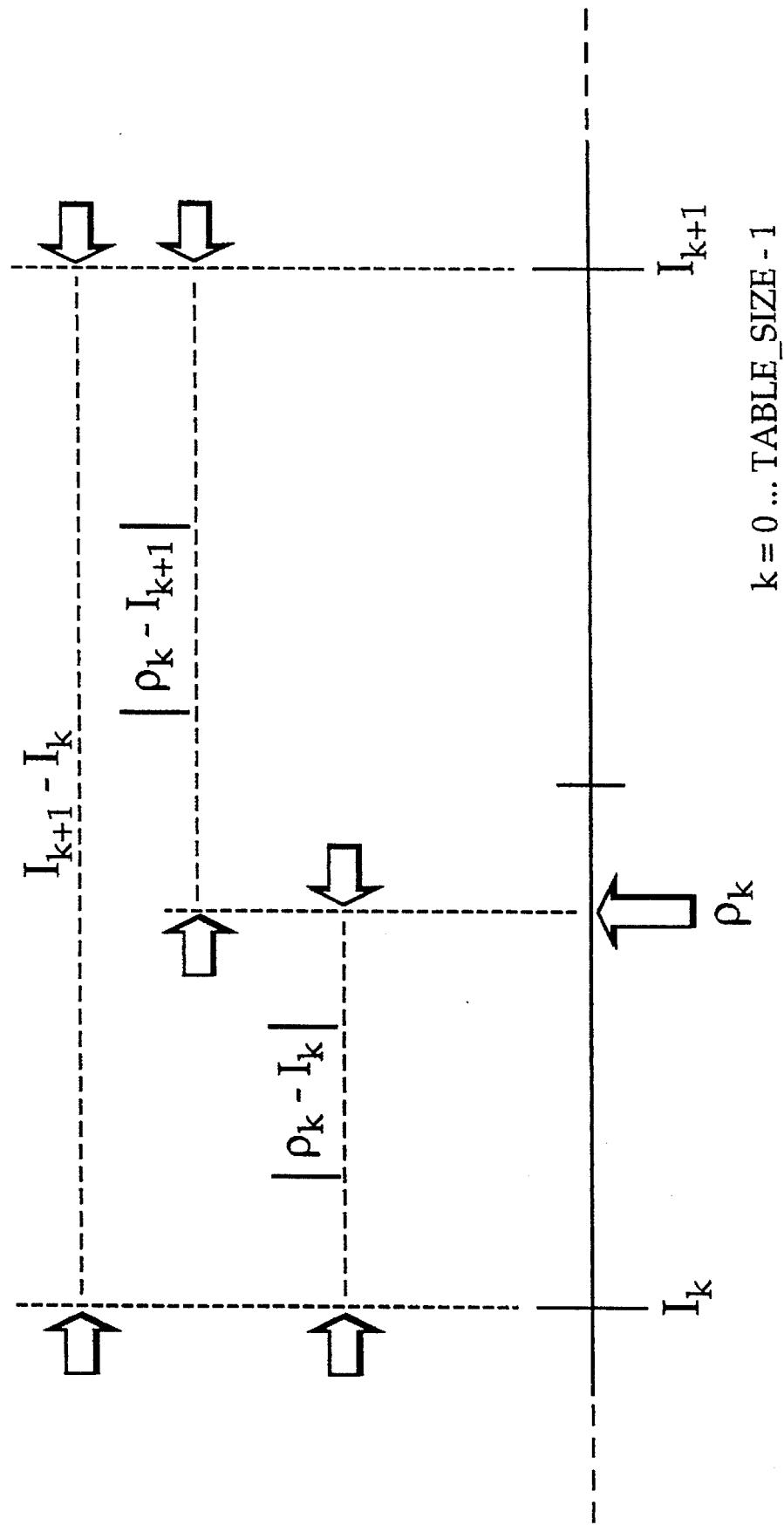
FIG. 3 represents the weighing method of the adopted error.

Referring now to FIG. 3, there is illustrated therein how portions of the error are attributed to two adjacent cells for a given value of amplitude $\rho k$. One way of minimizing the imprecision consists in utilizing the error for updating two adjacent cells. The error is weighed in such a way as to make a greater contribution to the nearest cell.

$$\epsilon_\rho(k) = \frac{\rho_k - I_k}{I_{kh} - I_k} S(\rho_k - \rho'_k) \quad (14)$$

$$\epsilon_\rho(k+1) = \frac{I_{kh} - \rho_k}{I_{kh} - I_k} S(\rho_k - \rho'_k)$$

$$\epsilon_\theta(k) = \frac{\rho_k - I_k}{I_{kh} - I_k} S(\theta_k - \theta'_k)$$

$$\epsilon_\theta(k+1) = \frac{I_{k+1} - \rho_k}{I_{kh} - I_k} S(\theta_k - \theta'_k).$$

This operation entails a slight increase in the convergence rate of the algorithm (the main contribution is made by the non uniform quantization) and a significant reduction of the imprecision in the error calculation (in practice one goes from the case in which a function is approximated by steps to the case in which the function is approximated by a piecewise-linear). The convergence can be considered as reached when:

$$|\epsilon_\rho(k,t)-\epsilon_\rho(k,t')|<\zeta$$

(15) for all k=) . . . TABLE-SIZE 1

$$|\epsilon_\theta(k,t)-\epsilon_\theta(k,t')|<\zeta$$

where $\zeta$ is a small dimension constant that equalifies the precision of the predistortion device while t and t' are two consecutive instants of visit of the kth cell of the tables. The greater the factor S, the faster the algorithm convergence will be: the optimal convergence rate is obtained for S= 0.5 Smax.

For smaller values the convergence rate slows down, for higher values greater than Smax the system tends to become unstable. Several values of S have been studied in order to verify the performances of the system in those cases of interest. The predistortion process corrects the input samples with the error read out from the tables. The table address is determined as described previously.

If $(\rho''_k, \theta''_k)$ denote the outputs of the predistortion device, one obtains:

$$\rho''_k = \rho_k + f[\epsilon\rho(k), \rho_k]$$

(16) $\theta''_k = \theta_k + f[\epsilon\theta(k), \rho k]$ where f (.) is an interpolating function which changes the error in order to reduce the imprecisions due to quantization. The trivial case corresponds to reading the error ((k) or (k+1) from the tables and adding it to the input sample; however, in order to reach a good spectral purity it is necessary to use a linear interpolations more complex interpolation methods can be used provided that the computation capacity of the used processor allows it. The coordinate conversion processes are described by e.g. (3): they, even if conceptually trivial, in a practical implementation require a remarkable computation time (about 80% of the total) because the computations involve trascendental functions—such as sine, cosine and arc tangent—multiplications and divisions. Observing the block diagram in FIG. 2, it is very important that the three required conversions (two from cartesian to polar for the inputs and one from polar to cartesian for the output) are to comply with the actual specifications of application. Optimized methods are available for calculating the trigonometric functions; one of these is the well known CORDIC: it is a matter of evaluating various arithmetical operations and trigonometric functions—in particular square root and arc tangent—oriented towards a VLSI implementation.

We claim:

1. A baseband predistortion system for providing adaptive linearization of a power amplifier, having an adaptive predistortion circuit with at least one updatable error table for providing updatable error table signals used for predistorting an input signal, and address generating means for generating addresses of said at least one updatable error table, characterized in that said address generating means generates decoded address signals for said at least one updatable error table as a function of the value of the amplitude of said input signal.

2. A system according to claim 1, characterized in that said address generating means generates the decoded address signals as a function of the distribution of the value of the amplitude of said input signal.

3. A system according to claim 1, characterized in that the updatable error table signals of said error table are determined as a weighed difference between said input signal and a distorted signal of the power amplifier.

4. A system according to claim 3, characterized in that said weighed difference is carried out through the storage of fractions of the error, calculated for each value of said input signal, in said at least one updatable error table.

5. A system according to claim 1, characterized in that said predistortion circuit predistorts said input signal as a function of error read out from said at least one updatable error table in correspondence with the address generated by said address generating means.

6. A system according to claim 5, characterized in that said predistortion circuit predistorts said input signal by algebraically adding to it the value of the error read out from said at least one updatable error table in correspondence with the address generated by said address generating means.

7. A system according to claim 1, characterized in that said at least one updatable error table is updated by writing new values of errors according to times independent from the read out times.

8. A system according to claim 1, characterized in that said address generating means further comprises:
- an address decoder, responsive to the value of the amplitude of said input signal, for providing amplitude-dependent address decoder signals; and
- an amplitude-dependent compensation table, responsive to the amplitude-dependent address decoder signals, for providing amplitude-dependent amplitude error table address signals, and for further providing amplitude-dependent phase error table address signals.

9. A baseband predistortion system for providing adaptive linearization of a power amplifier, having a predistortion circuit with at least one updatable error table for providing updatable error table signals used for predistorting an input signal, and address generating means for generating addresses of said at least one updatable error table, characterized in that said address generating means generates the addresses in such a way that every address on average has the same probability of occurrence.

10. A system according to claim 9, characterized in that said address generating means is formed by a storage device.

11. A radio transmitter for transmitting a signal on an antenna, the radio transmitter having an encoder (COD) for encoding an input signal, an adaptive predistortion device (PREDIST), means for converting an output signal of the adaptive predistortion device (PREDIST) by digital to analog converters (D/A), means for modulating (MOD) output signals of the digital to analog converters, means for amplifying (PA) the output signals of the modulating means (MOD), a demodulator (DEM) connected to an output signal of the amplifying means (PA), analog to digital converters (A/D) connected to the output of the demodulator (DEM), the output of the analog to digital converters (A/D) connected to the adaptive predistortion device (PREDIST), a local oscillator (LO) for generating oscillating signals for the modulating means (MOD) and the demodulator (DEM), and means for connecting the output signal of the amplifying means (PA) to the antenna, characterized in that the adaptive predistortion device (PREDIST) provide adaptive linearization of the amplifying means (PA), and wherein the adaptive predistortion device (PREDIST) includes at least one updatable error table (err-$\rho$, err-$\theta$), and address generating means for generating decoded address signals for said at least one updatable error table (err-$\rho$, err-$\theta$) that provides updatable error table signals used for predistorting said input signal, and wherein the address generating means generates the decoded address signals as a function of the value of the amplitude of said input signal.

\* \* \* \* \*